(12) United States Patent
Uchida

(10) Patent No.: US 7,525,172 B2
(45) Date of Patent: Apr. 28, 2009

(54) SEMICONDUCTOR DEVICE

(75) Inventor: Shinichi Uchida, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 119 days.

(21) Appl. No.: 11/585,167

(22) Filed: Oct. 24, 2006

(65) Prior Publication Data
US 2007/0090412 A1    Apr. 26, 2007

(30) Foreign Application Priority Data
Oct. 25, 2005  (JP)  ............................. 2005-309976

(51) Int. Cl.
*H01L 29/00* (2006.01)
(52) U.S. Cl. ...................... 257/500; 257/544
(58) Field of Classification Search ................. 257/500, 257/544, 545
See application file for complete search history.

(56) References Cited

U.S. PATENT DOCUMENTS 6,459,134 B2    10/2002   Ohguro et al.
6,525,394 B1 *   2/2003   Kuhn et al. ................ 257/509
2002/0089030 A1 *   7/2002   Kling ........................ 257/499

FOREIGN PATENT DOCUMENTS

JP    2001-345428 A    12/2001
JP    2002-76289 A     3/2002

* cited by examiner

*Primary Examiner*—Mark Prenty
(74) *Attorney, Agent, or Firm*—Sughrue Mion, PLLC

(57) ABSTRACT

Disclosed is a semiconductor device has a semiconductor substrate of a first conductivity type in which at least a first element-forming region and a second element-forming region are formed. Wells are formed in respective ones of the element-forming regions of the semiconductor substrate, and the well of at least one element-forming region is of the first conductivity type. A guard ring of a second conductivity type is formed between the wells of the first and second element-forming regions, and a region of the first conductivity type having an impurity concentration lower than that of the well of the one element-forming region is formed between the guard ring and the well of the one element-forming region.

8 Claims, 10 Drawing Sheets

SEMICONDUCTOR DEVICE

FIELD OF THE INVENTION

This invention relates to a semiconductor device.

BACKGROUND OF THE INVENTION

An increase in the integration and functionality of semiconductor devices has been accompanied by the mounting of analog and digital circuits on a single semiconductor substrate constituting a semiconductor device.

When analog and digital circuits are mounted on the same substrate, there are instances where noise generated by the digital circuit penetrates into the analog circuit through the substrate and hampers operation of the analog circuit.

It has been proposed to provide a guard ring between the analog and digital circuits in order to solve this problem.

By way of example, as illustrated in FIG. 9 showing a semiconductor device 200 according to the prior art, it has been proposed to form a P-type semiconductor substrate 201 to have an N-well 202 that constructs an analog-circuit forming region and an N-well 203 that constructs a digital-circuit forming region, and to form a guard ring 204 in the N-well 203 of the digital-circuit forming region (see the specification of Japanese Patent Kokai Publication No. JP-P2001-345428A, referred to as "Patent Document 1" below).

An analog circuit 205 is formed in the N-well 202, and a digital circuit 206 is formed in the N-well 203. According to Patent Document 1, propagation of noise from the digital-circuit forming region to the analog-circuit forming region can be prevented by adjusting the depth of the guard ring 204.

Further, as illustrated in FIG. 10 showing a semiconductor device 100 according to the prior art, it has been proposed to form a P-type semiconductor substrate 101 to have a P-well 102 provided with an NMOS transistor 103 and an N-well 105 provided with a PMOS transistor 104, and to provide an N-type guard ring 106 that is in contact with the P-well 102 and N-well 105 (see the specification of Japanese Patent Kokai Publication No. JP-P2002-76289A, referred to as "Patent Document 2" below). Reference numerals 107, 108 in FIG. 10 denote guard rings.

Since the semiconductor device 200 of Patent Document 1 shown in FIG. 9 is such that the P-type semiconductor substrate 201 is formed to have the N-well 202 that constructs the analog-circuit forming region and the N-well 203 that constructs the digital-circuit forming region, PN junctions are formed between the N-wells 202, 203 and the P-type semiconductor substrate 201. Consequently, the arrangement is such that it is difficult for noise from the digital-circuit forming region to propagate to the analog-circuit forming region.

However, Patent Document 1 does not give any consideration with regard to propagation of noise in a case where the N-well 202 of the analog-circuit forming region or the N-well 203 of the digital-circuit forming region is changed to a P-well and the PN junction is no longer formed. This means that with the structure described in Patent Document 1, it is difficult to suppress the propagation of noise in a case where the N-well 202 of the analog-circuit forming region or the N-well 203 of the digital-circuit forming region is changed to a P-well.

On the other hand, in the semiconductor device 100 described in Patent Document 2 shown in FIG. 10, the P-well 102 is formed in the P-type semiconductor substrate 101. Since the N-type guard ring 106 that contacts the P-well 102 is formed between the P-well 102 and the N-well 105, a PN junction is formed between the P-well 102 and the guard ring 106 and it is presumed that the propagation of noise can be suppressed to a certain extent.

In recent years, however, there has been increasing demand for more reliable suppression of noise propagation, especially for the prevention of noise propagation in the high-frequency region. With the semiconductor device 100, however, it is difficult to satisfy such a demand.

The inventors have conjectured that a large junction capacitance between the N-type guard ring 106 and P-well 102 in the semiconductor device 100 is the reason why propagation of noise (especially propagation of noise in the high-frequency region) cannot be suppressed satisfactorily.

SUMMARY OF THE DISCLOSURE

The present invention provides a semiconductor device having a semiconductor substrate of a first conductivity type in which at least a first element-forming region and a second element-forming region are formed; a well being formed in each of the element-forming regions of the semiconductor substrate; the well of at least one of the element-forming regions being of the first conductivity type; a guard ring of a second conductivity type being formed between the wells; and a region of the first conductivity type having an impurity concentration lower than that of the well of the one element-forming region being disposed between the guard ring and the well of the one element-forming region.

In accordance with this arrangement, a region of a first conductivity type having an impurity concentration lower than that of a well of the first conductivity type is disposed between a guard ring of a second conductivity type and the well of the first conductivity type of one element-forming region. Although a PN junction is formed between the guard ring of the second conductivity type and the region of the first conductivity type, the impurity concentration of the region of the first conductivity type is lower than that of the well of the first conductivity type of the one element-forming region. As a result, the junction capacitance of the PN junction can be reduced in comparison with the conventional structure in which the well of the first conductivity type of the one element-forming region and the guard ring are brought into contact with each other.

In addition, by disposing the region of the first conductivity type having an impurity concentration lower than that of the well of the first conductivity type of the one element-forming region between the guard ring of the second conductivity type and the well of the first conductivity type of the one element-forming region, a region having a high resistance value can be formed between the guard ring of the second conductivity type and the well of the first conductivity type of the one element-forming region.

Thus, according to the present invention, junction capacitance can be reduced and resistance value increased, thereby making it possible to enlarge the impedance of the circuit formed between the guard ring of the second conductivity type and the well of the first conductivity type of the one element-forming region. As a result, propagation of noise between the element-forming regions, particularly propagation of noise in the high-frequency region, can be cut off reliably.

The meritorious effects of the present invention are summarized as follows.

Thus the present invention provides a semiconductor device in which propagation of noise to an element-forming region can be positively suppressed.

Other features and advantages of the present invention will be apparent from the following description taken in conjunction with the accompanying drawings, in which like reference characters designate the same or similar parts throughout the figures thereof.

BRIEF DESCRIPTIONS OF THE DRAWINGS

PREFERRED EMBODIMENTS OF THE INVENTION

Figure 1:
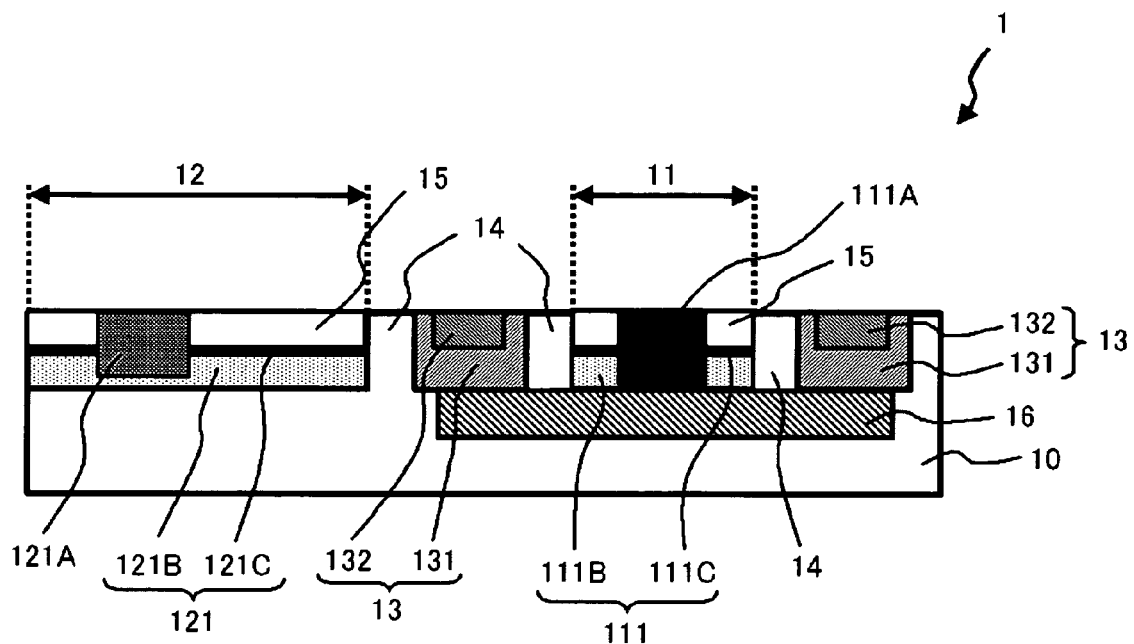
FIG. 1 is a sectional view illustrating a semiconductor device according to an embodiment of the present invention.

A preferred embodiment of the present invention will now be described in detail with reference to the drawings. FIG. 1 illustrates a semiconductor device 1 according to the preferred embodiment An overview of the semiconductor device 1 will be described first. The semiconductor device 1 has a semiconductor substrate 10 of a first conductivity type in which at least a first element-forming region 11 and a second element-forming region 12 are formed. Wells 111 and 121 are formed in respective ones of the element-forming regions 11 and 12 of the semiconductor substrate, and the well 111 of at least one element-forming region 11 is of the first conductivity type. A guard ring 13 of a second conductivity type is formed between the wells 111 and 121, and a region 14 of the first conductivity type having an impurity concentration lower than that of the well 111 of the one element-forming region 11 is formed between the guard ring 13 and the well 111 of the one element-forming region 11.

The structure of the semiconductor device 1 will now be described in detail.

The semiconductor device 1 has the semiconductor substrate 10. In this embodiment, the semiconductor substrate 10 is a P-type (first conductivity type) silicon substrate. The semiconductor substrate 10 is partitioned into the first element-forming region (an analog-circuit forming region in this embodiment) 11 and the second element-forming region (a digital-circuit forming region in this embodiment) 12.

The P-type well (P-well) 111 is formed in the analog-circuit forming region 11 of the semiconductor substrate 10. The P-well 111 is formed in the surface layer of the semiconductor substrate 10. An analog circuit 111A that includes an NMOS transistor or the like (not shown) is formed in the P-well 111. The P-well 111 is formed by implanting a P-type impurity (e.g., boron) into the semiconductor substrate 10. Further, an element isolation film 15 is formed above the P-well 111 so as to surround the analog circuit 111A. The P-well 111 has a first diffusion layer 111B and a second diffusion layer 111C formed on the first diffusion layer 111B. The second diffusion layer 111C is formed between the first diffusion layer 111B and the element isolation film 15, and the impurity concentration of the second diffusion layer 111C is higher than that of the first diffusion layer 111B.

The digital-circuit forming region 12 is provided adjacent to the analog-circuit forming region 11. Here the digital-circuit forming region 12 is a region in which a logic circuit is provided. The P-type well (P-well) 121 is formed in the digital-circuit forming region 12. The P-well 121 is formed in the surface layer of the semiconductor substrate 10. A digital circuit 121A that includes an NMOS transistor or the like (not shown) is formed in the P-well 121. Further, an element isolation film 15 is formed above the P-well 121 so as to surround the digital circuit 121A.

The P-well 121 of the digital-circuit forming region 12 and the P-well 111 of the analog-circuit forming region 11 are disposed adjacent to each other with a prescribed spacing between them. In a manner similar to that of the P-well 111, the P-well 121 is formed by implanting a P-type impurity (e.g., boron) into the semiconductor substrate 10. The P-well 121 has a first diffusion layer 121B and a second diffusion layer 121C formed on the first diffusion layer 121B. The second diffusion layer 121C is formed between the first diffusion layer 121B and the element isolation film 15, and the impurity concentration of the second diffusion layer 121C is higher than that of the first diffusion layer 121B.

In this embodiment, the impurity concentration of the first diffusion layer 121B of P-well 121 and the impurity concentration of the first diffusion layer 111B of P-well 111 are approximately equal. Similarly, the impurity concentration of the second diffusion layer 121C of P-well 121 and the impurity concentration of the second diffusion layer 111C of P-well 111 are approximately equal.

Figure 2:
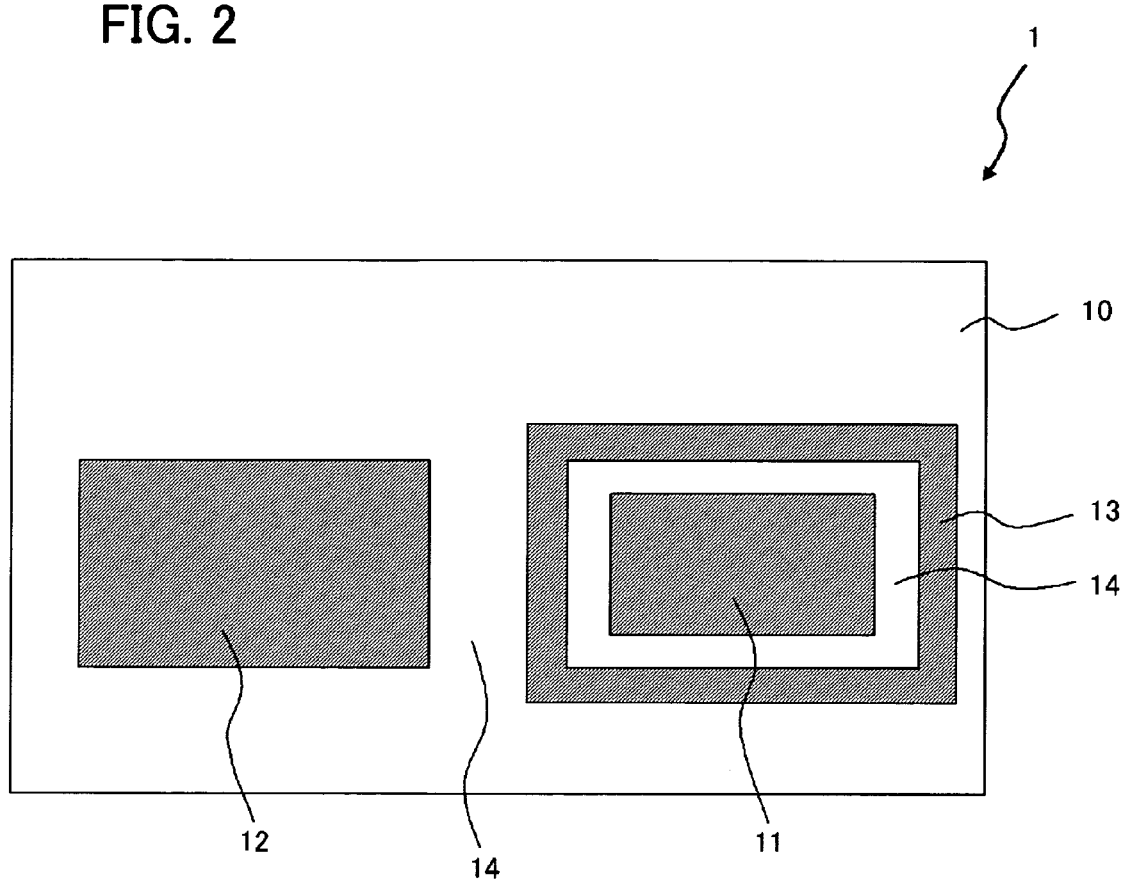
FIG. 2 is a plan view of the semiconductor device.

The guard ring 13 will be described. The guard ring 13 is formed between the analog-circuit forming region 11 and the digital-circuit forming region 12. More specifically, the guard ring 13 is placed between the P-well 111 of the analog-circuit forming region 11 and the P-well 121 of the digital-circuit forming region 12. In this embodiment, the guard ring 13 is formed into the shape of a ring so as to surround the P-well 111 of the analog-circuit forming region 11, as illustrated in FIG. 2. The guard ring 13 is an N-type diffusion layer formed in the surface layer of the semiconductor substrate 10.

The guard ring 13 has a first diffusion layer 131 of the second (N) conductivity type and a second diffusion layer 132 of the second (N) conductivity type.

The first diffusion layer 131 is formed into the shape of a ring so as to surround the P-well 111 of the analog-circuit forming region 11. In this embodiment, the depth of the first diffusion layer 131 is approximately the same as the depths of the P-wells 111 and 121.

The second diffusion layer 132 is formed in the element-forming surface of the semiconductor substrate 10 and is joined to the first diffusion layer 131. The depth of the second diffusion layer 132 is less than that of the first diffusion layer 131. The second diffusion layer 132 has an impurity concentration higher than that of the first diffusion layer 131. The second diffusion layer 132 is formed by implanting an impurity of the second conductivity type into the first diffusion layer 131 and is disposed inside the first diffusion layer 131. The second diffusion layer 132 may be formed into the shape of a ring so as to surround the P-well 111 of the analog-circuit forming region 11 in a manner similar to that of the first diffusion layer 131. Alternatively, the second diffusion layer 132 need not be ring-shaped.

The second diffusion layer 132 is provided in order to fix the potential of the first diffusion layer 131.

The region 14 of the first conductivity type (P type) is placed between the guard ring 13 and the P-well 111. In this embodiment, the guard ring 13 is formed into the shape of a ring so as to surround the P-well 111 and therefore the region 14 disposed between the guard ring 13 and the P-well 111 also is ring-shaped. Further, the region 14 of the first conductivity type is disposed between the guard ring 13 and the P-well 121 as well. The impurity concentration of the region of the first conductivity type is lower than that of the P-wells 11, 121 and, in this embodiment, is equal to that of the semiconductor substrate 10. That is, the region 14 of the first conductivity type is a region in which an impurity has not been implanted into the semiconductor substrate 10. The impurity concentration of the region 14 of the first conductivity type preferably is less than $1 \times 1015 \text{ cm}^{-3}$.

A deep well 16 of the second conductivity type (N type) is formed in the semiconductor substrate 10 of the semiconductor device 1. The deep well 16 is disposed on the bottom side of the P-well 111 of the analog-circuit forming region 11 (on the side opposite the element-forming surface of the semiconductor substrate 10) and on the bottom side of the region 14 of the first conductivity type between the guard ring 13 and the P-well 111 (on the side opposite the element-forming surface of the semiconductor substrate 10). That is, according to this embodiment, the deep well 16 is formed so as to cover the entire bottom surface of the P-well 111 and the entire bottom surface of the region 14 of the first conductivity type between the guard ring 13 and the P-well 111. Further, the deep well 16 is joined to the first diffusion layer 131 of the guard ring 13. In this embodiment, the impurity concentration of the deep well 16 and the impurity concentration of the first diffusion layer 131 are approximately equal.

A method of manufacturing the semiconductor device 1 will now be described.

Figure 3A:
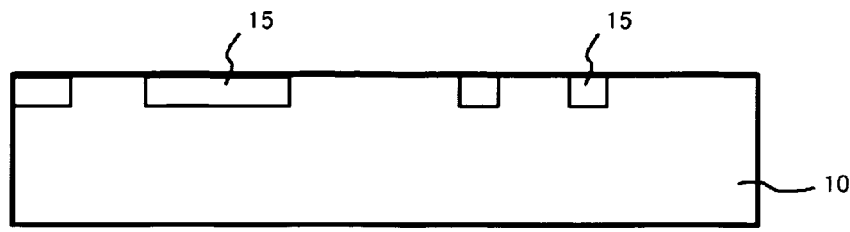
FIGS. 3A to 3D are schematic views illustrating a process for manufacturing the semiconductor device.

First, as illustrated in FIG. 3A, the element isolation film 15 is provided in the element-forming surface of the semiconductor substrate 10. More specifically, a shallow trench is formed and an insulating material is embedded in the shallow trench to thereby form the element isolation film 15.

Figure 3B:
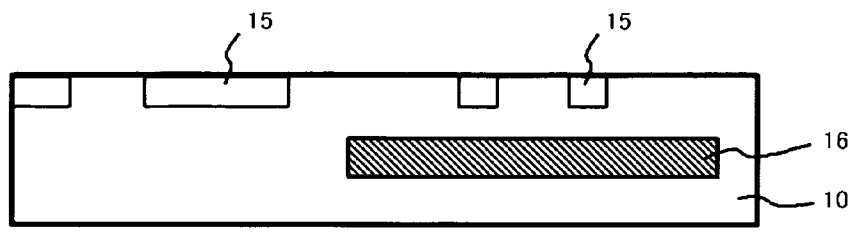

Next, a photoresist mask (not shown) is provided in the form of a prescribed pattern on the element-forming surface of the semiconductor substrate 10. An N-type impurity (e.g., phosphorous) is implanted into the semiconductor substrate 10 to thereby form the deep well 16 (see FIG. 3B). The deep well 16 is formed below a region planned for formation of the P-well 111 of the analog-circuit forming region 11.

Figure 3C:
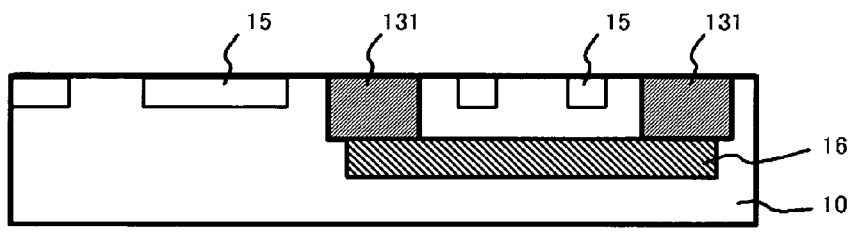

Next, the mask that was used in the formation of the deep well 16 is removed and a photoresist mask (not shown) is provided in the form of a prescribed pattern on the element-forming surface of the semiconductor substrate 10. An N-type impurity (e.g., phosphorous) is implanted into the semiconductor substrate 10 to thereby form the first diffusion layer 131 of the guard ring 13 above the deep well 16 (see FIG. 3C).

By way of example, in a case where an N-well and not only the P-well 121 has been formed in the digital-circuit forming region 12, it is preferred that the N-well of the digital-circuit forming region 12 also be formed when the first diffusion layer 131 of the guard ring 13 is formed.

Figure 3D:
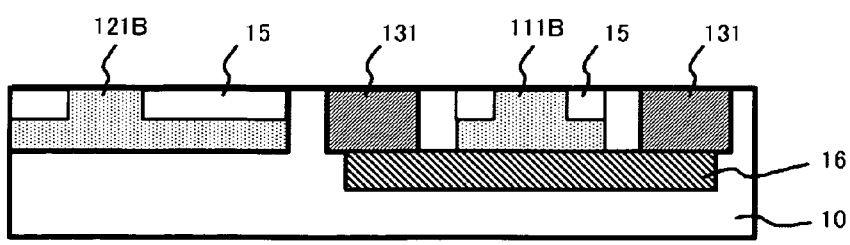

This is followed by removing the mask that was used in the formation of the first diffusion layer 131 and providing a new photoresist mask of a prescribed pattern. A P-type impurity (e.g., boron) is implanted into the semiconductor substrate 10 and the first diffusion layer 111B of P-well 111 and first diffusion layer 121B of P-well 121 are formed (see FIG. 3D).

Next, a P-type impurity (e.g., boron) is implanted above the first diffusion layers 111B, 121B to form the second diffusion layers 111C, 121C, respectively.

This is followed by forming the analog circuit 111A, which includes an NMOS transistor or the like (not shown), in the P-well 111 and forming the digital circuit 121A, which includes an NMOS transistor or the like (not shown), in the P-well 121. Although an N-type diffusion layer, which will serve as a source/drain region, is formed at the step of forming the analog circuit 111A and digital circuit 121A, the second diffusion layer 132 is formed in the first diffusion layer 131 simultaneously at the step of forming the N-type diffusion layer that will serve as the source/drain.

The semiconductor device 1 is manufactured by the process set forth above.

The effects of the semiconductor device 1 will be described next.

According to this embodiment, the region 14 of the first conductivity type (P type) the impurity concentration whereof is lower than that of the P-wells 111 and 121 is disposed between the N-type guard ring 13 and the P-wells 111 and 121.

Although a PN junction is formed between the N-type guard ring 13 and the region 14 of the first conductivity type (P type), the impurity concentration of the region 14 is lower than that of the P-wells 111 and 121. As a result, the junction capacitance of the PN junction (the capacitance of the portion surrounded by the oval in FIG. 4) can be reduced in comparison with the conventional structure in which the well of the first conductivity type of one element-forming region and the guard ring are brought into contact with each other.

Figure 4:
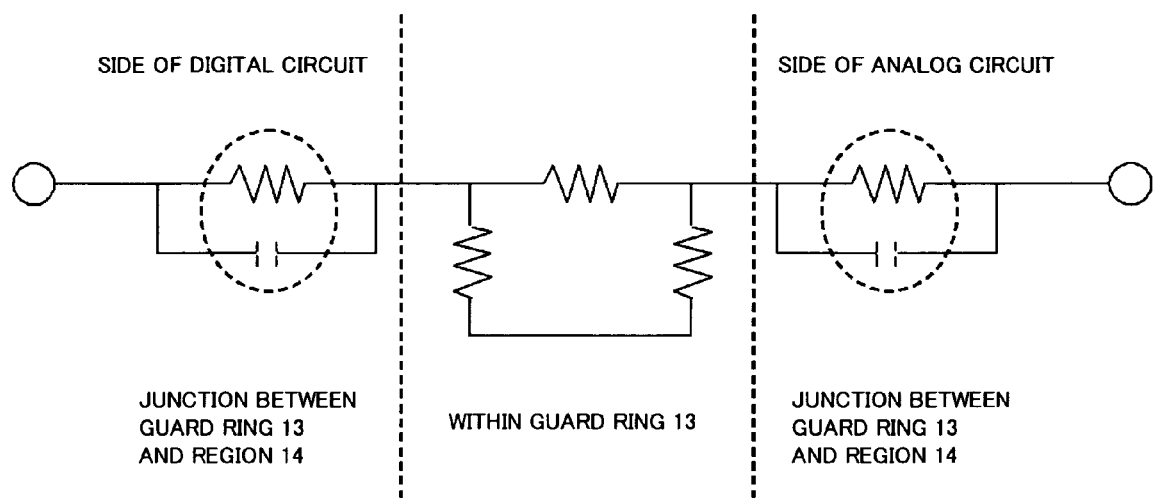
FIG. 4 is a diagram illustrating an equivalent circuit of a guard ring of the semiconductor device.

FIG. 4 is an equivalent circuit of the guard ring 13.

Furthermore, by providing the region 14 between the N-type guard ring 13 and P-type well 111 and between the N-type guard ring 13 and the P-type well 121, a region having a high resistance value can be formed between the N-type guard ring 13 and the P-type well 111 and between the N-type guard ring 13 and the P-type well 121. In other words, the resistance value of the portion surrounded by the oval in FIG. 4 can be raised.

Thus, junction capacitance can be reduced and resistance value raised in the semiconductor device 1. This makes it possible to enlarge the impedance of the circuit formed between the N-type guard ring 13 and the P-type well 111 and between the N-type guard ring 13 and the P-type well 121.

Impedance is expressed by the following Equation (1).

$$Z=R+j(\omega L-1/\omega C) \quad (1)$$

where ω, R, L and C represent angular frequency, electrical resistance, self-inductance and capacitance, respectively.

Reducing the junction capacitance (C) between the N-type guard ring 13 and region 14 of the first conductivity type (P type) results in a higher impedance Z, and enlarging the resistance value (R) also results in a higher impedance Z.

As a result, the propagation of noise between the analog-circuit forming region 11 and digital-circuit forming region 12, particularly the propagation of noise in the high-frequency region, can be cut off reliably.

According to this embodiment, since the region 14 is provided both between the N-type guard ring 13 and the P-type well 111 and between the N-type guard ring 13 and the P-type well 121, the propagation of noise between the analog-circuit forming region 11 and digital-circuit forming region 12, particularly the propagation of noise in the high-frequency region, can be cut off even more reliably.

According to this embodiment, the impurity concentration of the region 14 is made the same as that of the semiconductor substrate 10. That is, since the region 14 can be provided without implanting an impurity anew, labor is not involved in the manufacture of the semiconductor device 1.

Further, according to this embodiment, the guard ring 13 is formed into the shape of a ring so as to surround the P-type well of the analog-circuit forming region 11. As a result, the propagation of noise from the digital-circuit forming region 12 to the analog-circuit forming region 11 can be cut off reliably by the guard ring 13.

Furthermore, the semiconductor device 1 is provided with the deep well 16 that is joined to the guard ring 13 and that covers the entire bottom surface of the P-well 111 of analog-circuit forming region 11.

Owing to the provision of the deep well 16, noise that propagates through the region at the bottom surface of the semiconductor substrate 10 can be prevented from reaching the P-well 111 of analog-circuit forming region 11. By providing the deep well 16 in addition to the guard ring 13, propagation of noise from the digital-circuit forming region 12 to the analog-circuit forming region 11 can be cut off even more reliably.

In this embodiment, the guard ring 13 has the first diffusion layer 131 and the second diffusion layer 132 that is joined to the first diffusion layer 131. By supplying the second diffusion layer 132 with an electric potential, the potential of the first diffusion layer 131 is fixed and the PN junction between the first diffusion layer 131 and the region 14 and, furthermore, the PN junction between the deep well 16 joined to the first diffusion layer 131 and the portion of the semiconductor substrate 10 at the bottom side thereof underlying the 16 are reverse-biased. As a result, propagation of noise between the analog-circuit forming region 11 and the digital-circuit forming region 12 can be cut off more reliably.

Furthermore, since the second diffusion layer 132 of the guard ring 13 is formed at the same time that the N-type diffusion layer serving as the source/drain regions of the analog circuit 111A and digital circuit 121A is formed, labor is not involved in the formation of the second diffusion layer 132.

It should be noted that the present invention is not limited to the foregoing embodiment and that modifications and improvements within limits in which the object of the invention can be attained are covered by the present invention.

Figure 5:
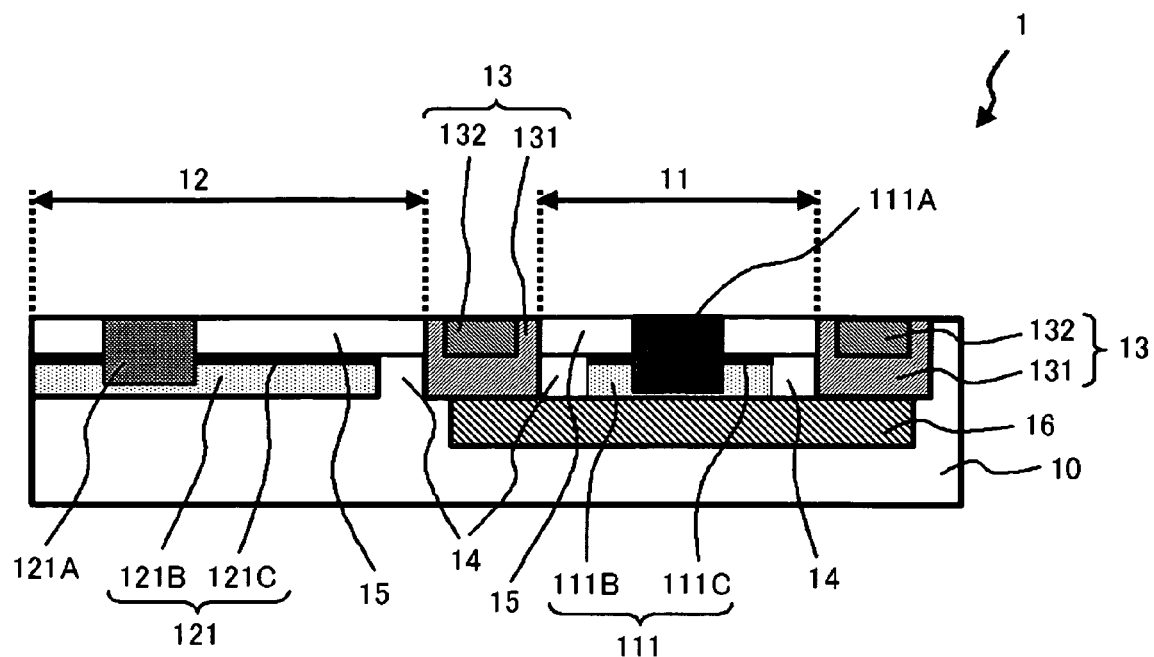
FIG. 5 is a sectional view illustrating a modification of the present invention.

By way of example, as illustrated in FIG. 1, the element isolation film 15 is not in contact with the guard ring 13 in the foregoing embodiment. However, an arrangement may be adopted in which the element isolation film 15 is made to contact the guard ring 13, as shown in FIG. 5.

Furthermore, in the foregoing embodiment, the deep well 16 is provided so as to cover the entire bottom side of the P-well 111, although this does not impose a limitation. For example, the deep well may be formed into a grid-like configuration. However, in comparison with a case where the deep well is provided in the form of a grid, providing the deep well 16 so as to cover the entire bottom side of the P-well 111 is more reliable in terms of cutting off noise that propagates from the bottom side surface of the semiconductor substrate 10.

In this embodiment, the deep well 16 is formed. However, this does not impose limitation upon the invention and it is permissible to adopt arrangements in which the deep well 16 is not formed, as illustrated in FIGS. 6A and 6B, by way of example.

Figure 6A:
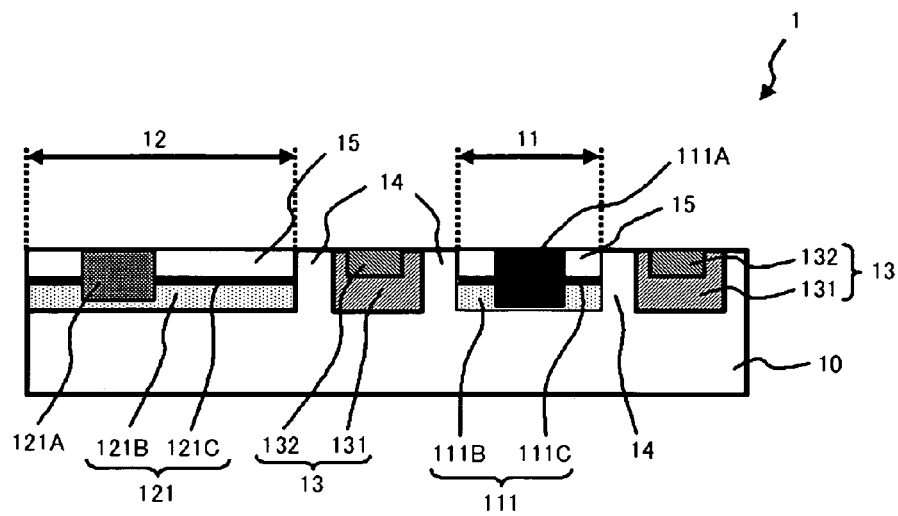
FIGS. 6A and 6B are sectional views illustrating modifications of the present invention.
Figure 6B:
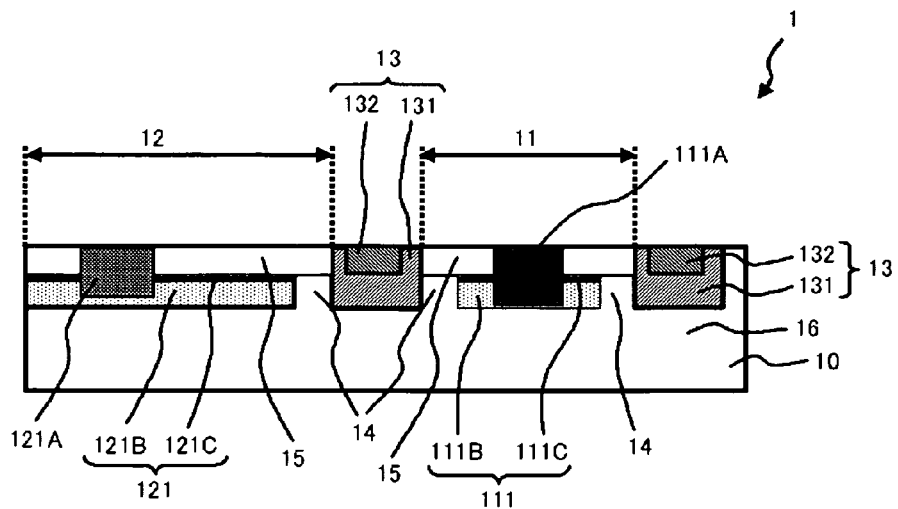

FIG. 6A illustrates a structure in which the element isolation film 15 is not in contact with the guard ring 13, and FIG. 6B illustrates a structure in which the element isolation film 15 is in contact with the guard ring 13. Thus, as illustrated in FIGS. 6A and 6B, the process for manufacturing the semiconductor device can be simplified by not forming the deep well 16.

Figure 7:
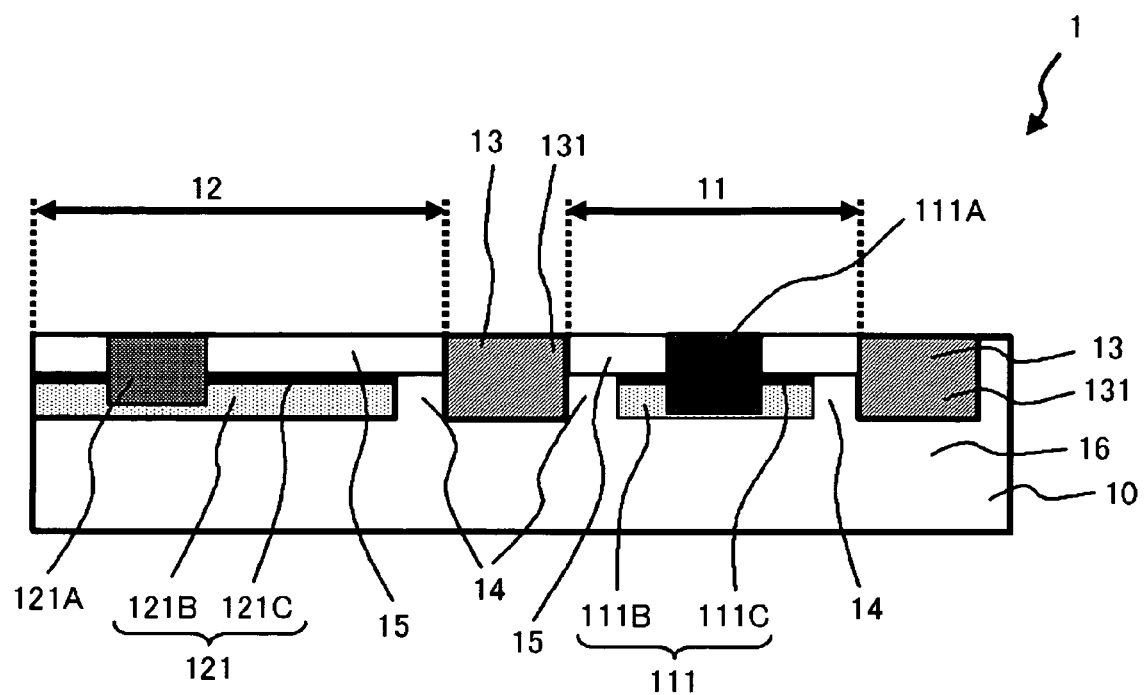
FIG. 7 is a sectional view illustrating a modification of the present invention.

In the embodiment described above, the guard ring 13 has the first diffusion layer 131 and the second diffusion layer 132 joined to the first diffusion layer 131. However, the invention is not limited to such an arrangement. For example, an arrangement in which the guard ring 13 has only the first diffusion layer 131 may be adopted, as illustrated in FIG. 7.

In the foregoing embodiment, a structure in which the P-well 111 of analog-circuit forming region 11 and the P-well 121 of digital-circuit forming region 12 are placed adjacent to each other is adopted. However, the invention is not limited to such an arrangement. For example, the P-well 111 of analog-circuit forming region 11 and an N-well of digital-circuit forming region 12 may be placed adjacent to each other. Furthermore, an N-well of analog-circuit forming region 11 and the P-well 121 of digital-circuit forming region 12 may be placed adjacent to each other.

In the foregoing embodiment, the region 14 formed between the guard ring 13 and the P-well 111 and between the guard ring 13 and the P-well 121 has the same impurity concentration as that of the semiconductor substrate 10, and this is a region in which an impurity has not been implanted into the semiconductor substrate 10. However, this does not impose a limitation and the region 14 may be formed by implanting an impurity into the semiconductor substrate 10.

Further in the foregoing embodiment, the guard ring 13 is provided in the shape of a ring so as to surround the P-well 111, although the invention is not limited to this arrangement. It will suffice if the guard ring is disposed between the P-well 111 of the analog-circuit forming region 11 and the P-well 121 of the digital-circuit forming region 12 and is provided so as to cover the P-well 111 from at least one side thereof when the digital-circuit forming region 12 is viewed from the side.

Figure 8A:
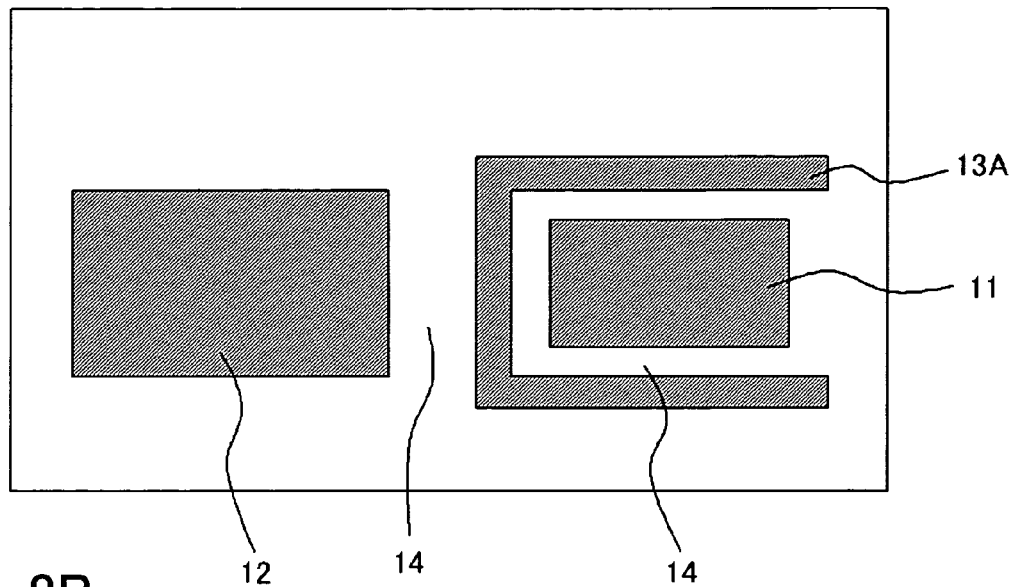
FIGS. 8A and 8B are sectional views illustrating modifications of the present invention.
Figure 8B:
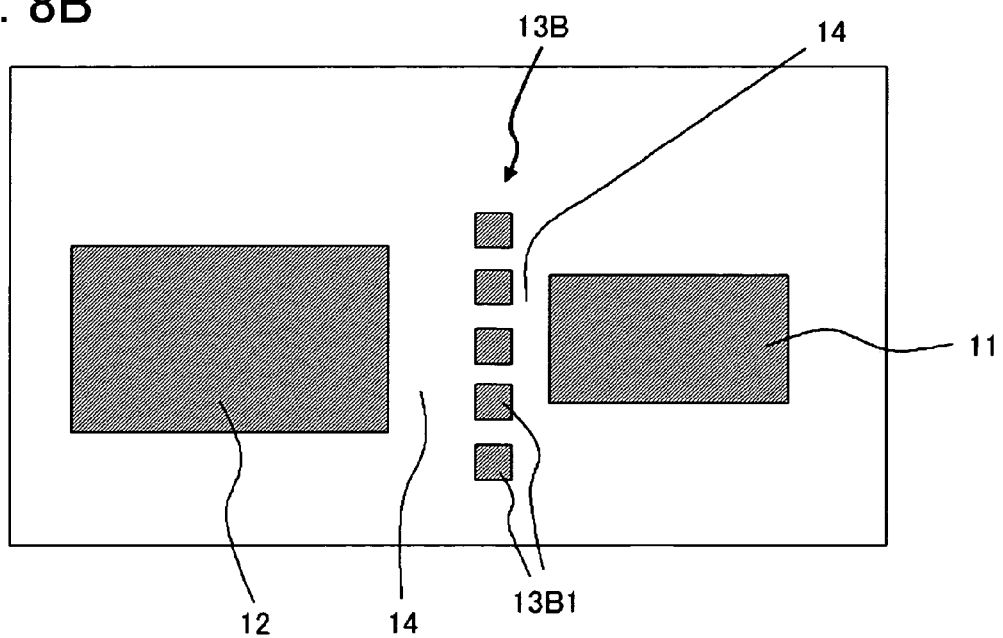
Figure 9:
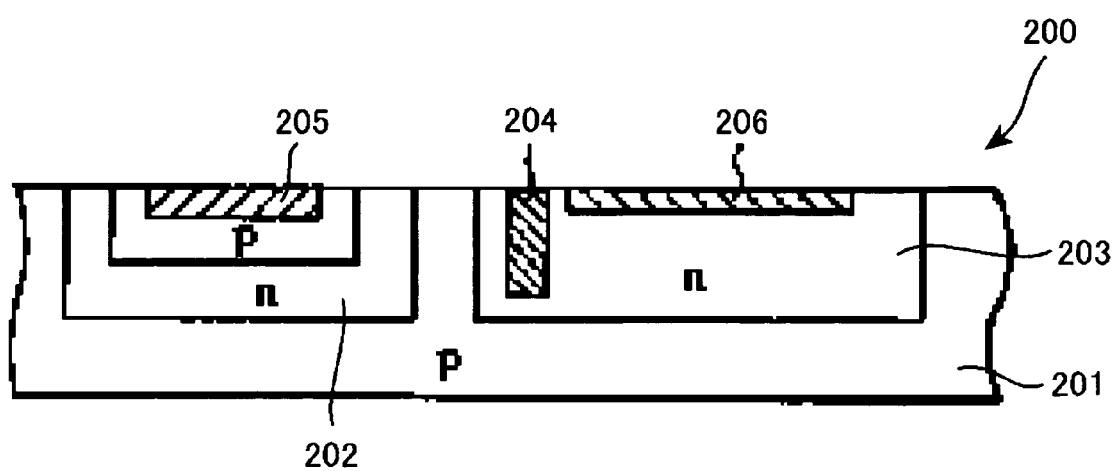
FIG. 9 is a diagram illustrating a semiconductor device according to the prior art.
Figure 10:
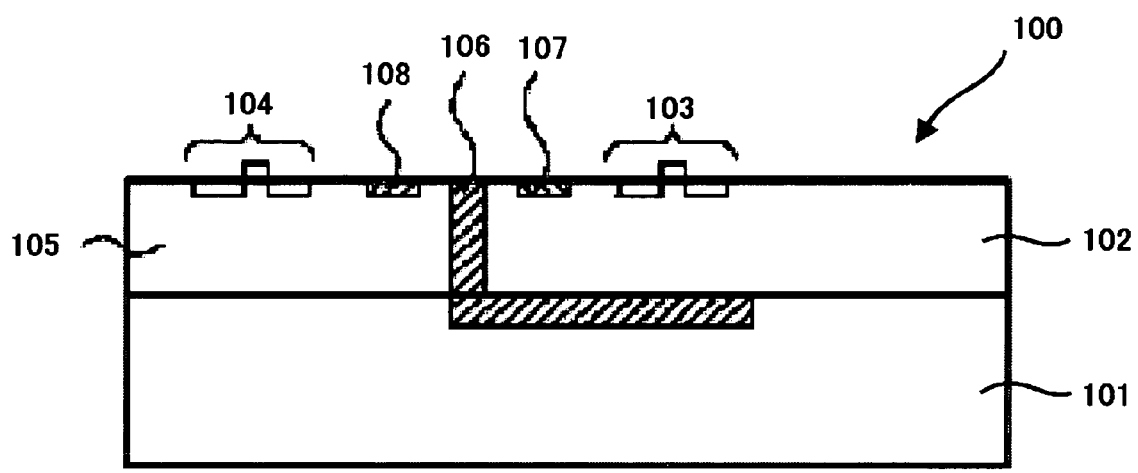
FIG. 10 is a diagram illustrating a semiconductor device according to the prior art.

For example, as illustrated in FIG. 8A, a guard ring 13A may have a planar shape that is substantially a C-shape in the plane. Further, as illustrated in FIG. 8B, a guard ring 13B may be composed of a plurality of guard ring portions 13B1. The guard ring portions 13B1 may be arranged at prescribed intervals between the P-well 111 of analog-circuit forming region 11 and the P-well 121 of digital-circuit forming region 12.

Although the P-type semiconductor substrate 10 is used in the foregoing embodiment, this does not impose a limitation and it is permissible to use an N-type semiconductor substrate, by way of example. In such case the guard ring can be made of the P type and the well of at least one of the analog-circuit and digital-circuit forming regions can be made of the N type. Further, it will suffice if the region 14 formed between the wells and the guard ring is an N-type region.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
a semiconductor substrate of a first conductivity type in which at least a first element-forming region and a second element-forming region are formed;
a first well and a second well being formed in the first and second element-forming regions of said semiconductor substrate, respectively;
at least one of said first and second wells being of the first conductivity type;
an element isolation film formed above at least one of said wells;
a guard ring of a second conductivity type being formed between said wells of said first and second element-forming regions; and
a first region of the first conductivity type having an impurity concentration lower than that of at least one of the first and second wells of the element-forming regions and being disposed between said guard ring and said at least one of the first and second wells of the element-forming regions.

2. The device according to claim 1, wherein the well of the other element-forming region is of the first conductivity type; and
a second region of the first conductivity type having an impurity concentration lower than that of said well of said other element-forming region is disposed between said guard ring and said well of said other element-forming region.

3. The device according to claim 1, wherein the impurity concentration of the first region is approximately equal to that of said semiconductor substrate.

4. The device according to claim 1, wherein said guard ring comprises:
a first diffusion layer of the second conductivity type; and
a second diffusion layer of the second conductivity type joined to said first diffusion layer and formed in an element-forming surface of said semiconductor substrate;
wherein an impurity concentration of said second diffusion layer is higher than that of said first diffusion layer.

5. The device according to claim 1, wherein said semiconductor substrate further comprises a deep well of the second conductivity type, said deep well being joined to said guard ring and covering a bottom side of said at least one well of the first conductivity type of one of the element-forming regions.

6. The device according to claim 1, wherein said guard ring surrounds said at least one well of the first conductivity type of one of the element-forming regions.

7. The device according to claim 1, wherein one of the element-forming regions is an analog-circuit forming region, and the other element-forming region is a digital-circuit forming region.

8. The device according to claim 1, wherein the guard ring is confined to a second region between said wells of the first and second element-forming regions.

* * * * *